(12) United States Patent
Walther

(10) Patent No.: US 12,224,533 B2
(45) Date of Patent: Feb. 11, 2025

(54) PLUG FOR AN INTERNET-OF-THINGS DEVICE

(71) Applicant: PERINET GMBH, Berlin (DE)

(72) Inventor: Karsten Walther, Königs Wusterhausen (DE)

(73) Assignee: PERINET GMBH, Berlin (DE)

( * ) Notice: Subject to any disclaimer, the term of this patent is extended or adjusted under 35 U.S.C. 154(b) by 0 days.

(21) Appl. No.: 17/767,736

(22) PCT Filed: Oct. 9, 2020

(86) PCT No.: PCT/EP2020/078373
§ 371 (c)(1),
(2) Date: Apr. 8, 2022

(87) PCT Pub. No.: WO2021/069641
PCT Pub. Date: Apr. 15, 2021

(65) Prior Publication Data
US 2024/0120688 A1    Apr. 11, 2024

(30) Foreign Application Priority Data
Oct. 9, 2019   (DE) .................. 10 2019 127 134.7

(51) Int. Cl.
*H01R 13/66* (2006.01)
*H01R 13/52* (2006.01)
*H01R 13/627* (2006.01)

(52) U.S. Cl.
CPC ..... *H01R 13/6641* (2013.01); *H01R 13/5219* (2013.01); *H01R 13/6273* (2013.01)

(58) Field of Classification Search
CPC ............ H01R 13/6641; H01R 13/5219; H01R 13/6273
(Continued)

(56) References Cited

U.S. PATENT DOCUMENTS 6,617,939 B1   9/2003  Vermeersch
7,837,513 B2   11/2010 Millette et al.
(Continued)

FOREIGN PATENT DOCUMENTS

CN   1943078 A    4/2007
CN   101416359 A  4/2009
(Continued)

OTHER PUBLICATIONS

Liang et al., "Structure Improvement of High-Speed Transmission Electrical Connector Base on Electromagnetic Compatibility," *Journal of Microwaves*, 33(6), Dec. 2017. (4 pages).
(Continued)

*Primary Examiner* — Gary F Paumen
(74) *Attorney, Agent, or Firm* — Seed IP Law Group LLP

(57) ABSTRACT

A plug for connecting to an Internet-of-Things device is provided. The plug has a housing and a printed circuit board with a first and second end. The printed circuit board is provided in the housing. The first end of the printed circuit board is connected to a hybrid single pair Ethernet cable. The second end of the printed circuit board is provided with a plug-in face with contact surfaces, by means of which the plug can be coupled to the Internet-of-Things device. The plug also has an EMC protection unit in or on the printed circuit board.

8 Claims, 4 Drawing Sheets

(58) Field of Classification Search
USPC .................................................. 439/357, 271
See application file for complete search history.

(56) References Cited

U.S. PATENT DOCUMENTS

| | | | |
|---|---|---|---|
| 8,157,598 B2 | 4/2012 | Niitsu | |
| 8,449,313 B2 * | 5/2013 | Suzuki | H01R 13/6272 |
| | | | 439/357 |
| 8,939,735 B2 * | 1/2015 | Heidecker | H01R 13/6395 |
| | | | 439/282 |
| 8,944,855 B2 | 2/2015 | Bolouri-Saransar et al. | |
| 9,876,322 B2 | 1/2018 | Bolouri-Saransar et al. | |
| 10,418,756 B2 | 9/2019 | Fennen et al. | |
| 2005/0185357 A1 | 8/2005 | Hoopes | |
| 2011/0269329 A1 | 11/2011 | Pocrass | |
| 2012/0282807 A1 | 11/2012 | Regnier | |
| 2013/0210277 A1 | 8/2013 | Robinson | |
| 2015/0318642 A1 | 11/2015 | Lee et al. | |

FOREIGN PATENT DOCUMENTS

| | | |
|---|---|---|
| CN | 102099970 A | 6/2011 |
| CN | 102832471 A | 12/2012 |
| CN | 203562594 U | 4/2014 |
| CN | 103931058 A | 7/2014 |
| CN | 107026443 A | 8/2017 |
| CN | 208045874 U | 11/2018 |
| CN | 109075512 A | 12/2018 |

OTHER PUBLICATIONS

Wang et al., "Design of a USB3.0 interface electrical connector," *Electromechanical components*, 38(3), Jun. 2018. (12 pages) (with English machine translation).

* cited by examiner

PLUG FOR AN INTERNET-OF-THINGS DEVICE

BACKGROUND

Technical Field

In the field of Internet-of-Things (IoT), sensors and/or actuators are typically connected to a network via cables (or wirelessly) to allow communication with services in the network. Communication between the sensors and/or actuators and the services in the network can be based on an IP protocol, for example.

Description of the Related Art

Typically, IoT devices are connected to a network via Ethernet lines to enable data transmission. Electromagnetic compatibility (EMC) protective measures are implemented in the IoT devices.

BRIEF SUMMARY

Provided are improvements for electromagnetic compatibility (EMC) protection for IoT devices.

According to the invention, a plug for connecting to an IoT device is provided, having a housing and a printed circuit board. The first end of the printed circuit board is connected to a hybrid single pair Ethernet cable. The other end of the printed circuit board is provided with a plug-in face with contact surfaces, by means of which the plug can be coupled to an IoT device. An electromagnetic compatibility (EMC) protection unit is provided on the printed circuit board. The EMC protection is thus provided inside the plug housing.

According to one aspect of the invention, a seal is provided in the region of the second end of the printed circuit board between the plug-in face and the housing. Thus, a chamber or region is provided that is sealed by the housing and the seal.

According to one aspect of the invention, a locking element is provided on the housing outside the sealed region.

According to one aspect of the invention, a printed circuit board typically present in a plug for an IoT device is used to accommodate an EMC protection measure. In other words, an EMC protection measure is integrated into a housing of a plug for IoT devices.

According to one aspect of the invention, the housings of the plugs are rotated by 90° with respect to a printed circuit board of the IoT device. The plugs are thus attached to the printed circuit board of the IoT device in an upright position.

According to one aspect of the invention, the printed circuit board is arranged centrally with respect to the long side of the plug-in face and parallel to the short axis of the plug-in face.

In accordance with the relevant European EMC standard, protection against surge voltages is required for hybrid single pair Ethernet devices with a connection cable length of 30 m or longer. According to one aspect of the invention, a hybrid single pair Ethernet cable with a plug described above is provided for connecting to an Internet of Things device that allows a connection cable length greater than 30 m, even if the device does not have a surge voltage protection circuit. Thus, by using the plugs according to one aspect of the present invention the maximum length of the usable cables can be increased.

The necessary protection circuit (EMC protection unit), usually a special diode between the DC voltage terminals, is introduced into the plug, e.g., by soldering to the rear of the plug contacts.

According to one aspect of the present invention, the plug or plug connector has an M8 H-coded plug. Alternatively, an M8 D-coded plug can also be provided. The plugs support the IEEE802.3 Ethernet protocol standard. The plugs can be standardized according to PAS IEC61076-2-14.

According to one aspect of the present invention, the plug connector has four electrical terminals. Of the four electrical terminals, two are used for DC voltage transmission and two are used for data transmission based on the Ethernet standard.

The invention also relates to an Internet-of-Things device which has a plug connector that can be coupled to a plug according to one aspect of the present invention in order that the Internet-of-Things can be supplied with power as well as with data and/or commands via a hybrid single pair Ethernet cable. The Internet-of-Things is thus provided via the plug according to an aspect of the present invention and the hybrid single pair Ethernet cable located thereon, in order to be able to communicate with a network.

According to one aspect of the present invention, the Internet-of-Things device optionally has only one interface, namely the plug connector. This means that the Internet-of-Things device has neither a keyboard nor a display nor other interfaces for configuration by the user. Optionally, a web-based user interface can be used to set the parameters of the device.

Further embodiments of the invention are the subject matter of the dependent claims.

BRIEF DESCRIPTION OF THE SEVERAL VIEWS OF THE DRAWINGS

Advantages and exemplary embodiments of the invention are elucidated below with reference to the drawing.

DETAILED DESCRIPTION

Figure 1:
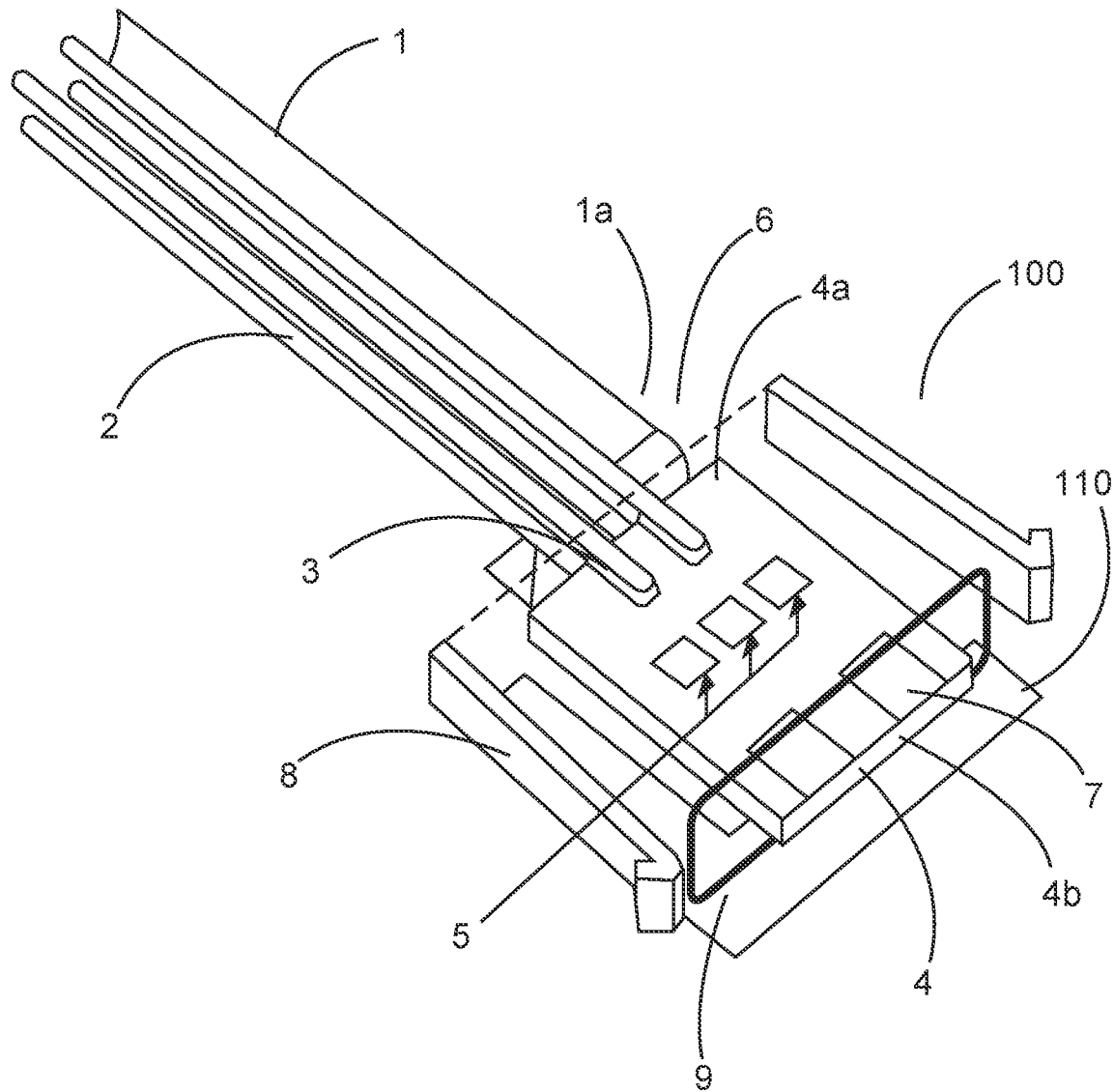
FIG. 1 shows a schematic perspective view of a plug according to a first exemplary embodiment of the invention.

FIG. 1 shows a schematic perspective view of a plug according to a first exemplary embodiment of the invention. A cable 1 having a plurality of cores 2 is provided on the plug 100. The plug 100 has a housing 6. The housing 6 can be molded around one end 1a of the cable 1. The housing 6 contains a printed circuit board 4 which is connected on its first side 4a to the cores 2 of the cable 1 via contact points 3, i.e., an electrical connection exists between the cores 2 and the contact points 3. An EMC protection unit 5 is provided on the printed circuit board 4. As an option, the EMC protection units 5 can be soldered onto the printed circuit board 4. At a second end 4b of the printed circuit board 4, there are contact surfaces 7. The contact surfaces 7 can optionally be designed as SMD-mountable contact pads 7. The plug 100 has a plug-in face 110, for example, with the four contact surfaces 7 evenly distributed over both sides of the printed circuit board.

On the outside of the housing 6 at least one locking element is provided, e.g., in the form of at least two springs 8 which are used for locking into a socket or a housing of an IoT device. The springs 8 can be optionally attached at the rear. The locking element can be used to absorb tensile forces on the cable 1.

At its second end 4b the housing 6 has a seal 9 which seals the plug-in face 110 in the plugged-in state. The remainder of the printed circuit board in the plug, including components and contacts and open conductor ends, can be sealed by encapsulation, for example. The locking element 8 is provided outside the sealed region.

The plug can be a M8 H-coded plug that supports the IEEE802.3 standard and can comply with the PAS IEC61076-2-14 standard. The plug 100 is used to couple an Internet-of-Things device (IoT device) to a network via a hybrid single pair Ethernet cable.

The EMC protection units are advantageously integrated in the housing 6 of the plug 100 so that a compact configuration of the plug and IoT device is achieved in the plugged-in state by partially or completely relocating the EMC protection from the IoT device into the plug.

According to one aspect of the invention, the cable 1 is a 4-pole T1 connection, i.e., it is a hybrid single pair Ethernet line SPE.

Figure 2:
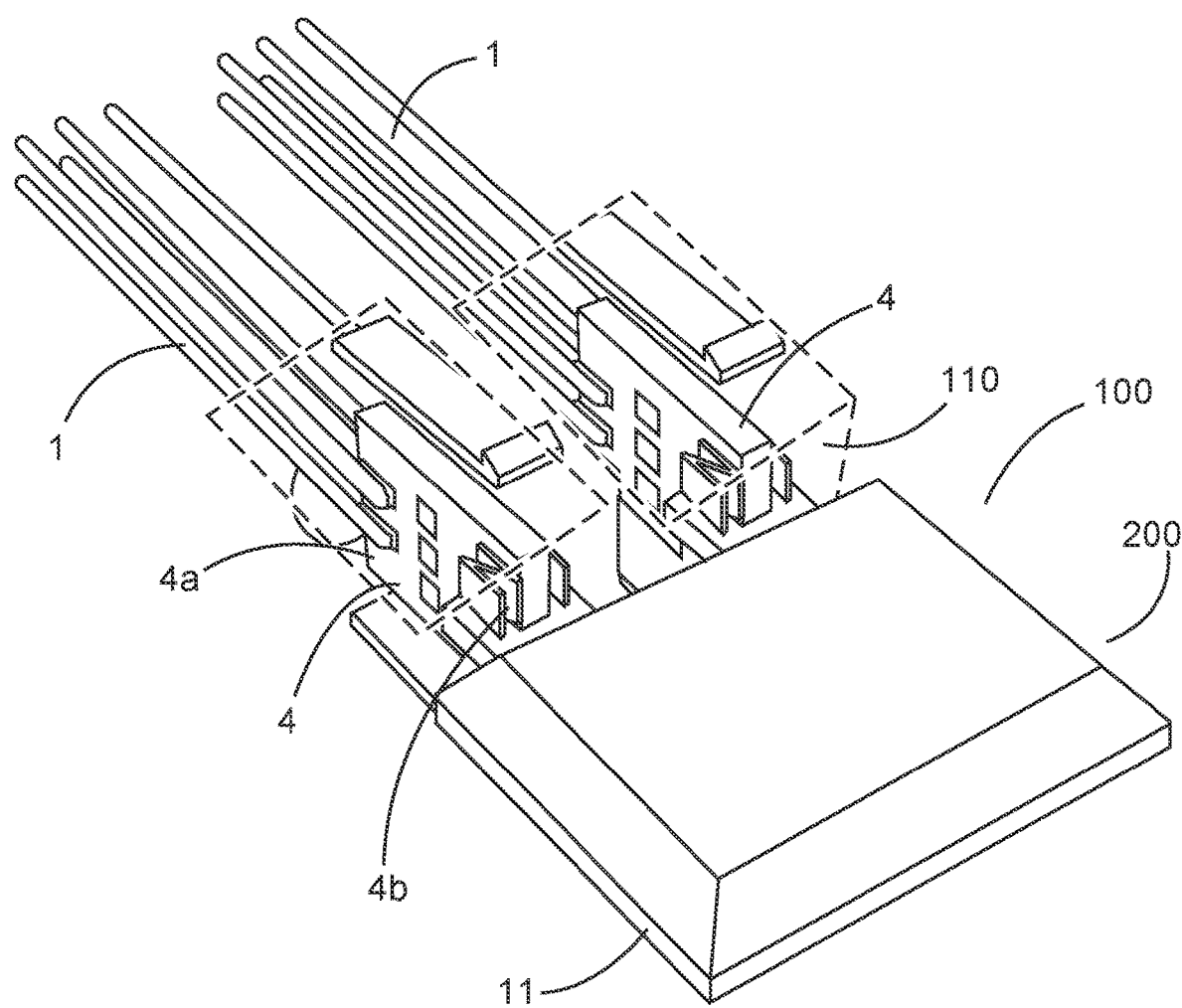
FIG. 2 shows a schematic perspective view of a plug according to a second exemplary embodiment of the invention.

FIG. 2 shows a schematic perspective view of a plug according to a second exemplary embodiment of the invention. In FIG. 2 the plugs 100 are provided in an upright position, which enables a space-saving connection of multiple plugs to an IoT device 200. The IoT device 200 has a printed circuit board 11 to which the plugs 100 are coupled. In particular, the plugs 100 are rotated by 90° with respect to the printed circuit board 11 of the IoT device 200. This is particularly advantageous as it improves the usability of the plugs, allowing the user to be better able to access the individual plugs. In addition, multiple plugs can be coupled to the IoT device 200 with a smaller space requirement. In particular, only contact surfaces but no components for contacting are required on the plug side.

Since the plug already has at least one locking element, the printed circuit board of the IoT device does not need to have a locking element.

The plug 100 according to the second exemplary embodiment corresponds to the plug according to the first exemplary embodiment.

According to the second exemplary embodiment of the invention, the cable 1 is a 4-pole T1 connection, i.e., it is a hybrid single pair Ethernet line SPE.

Figure 3:
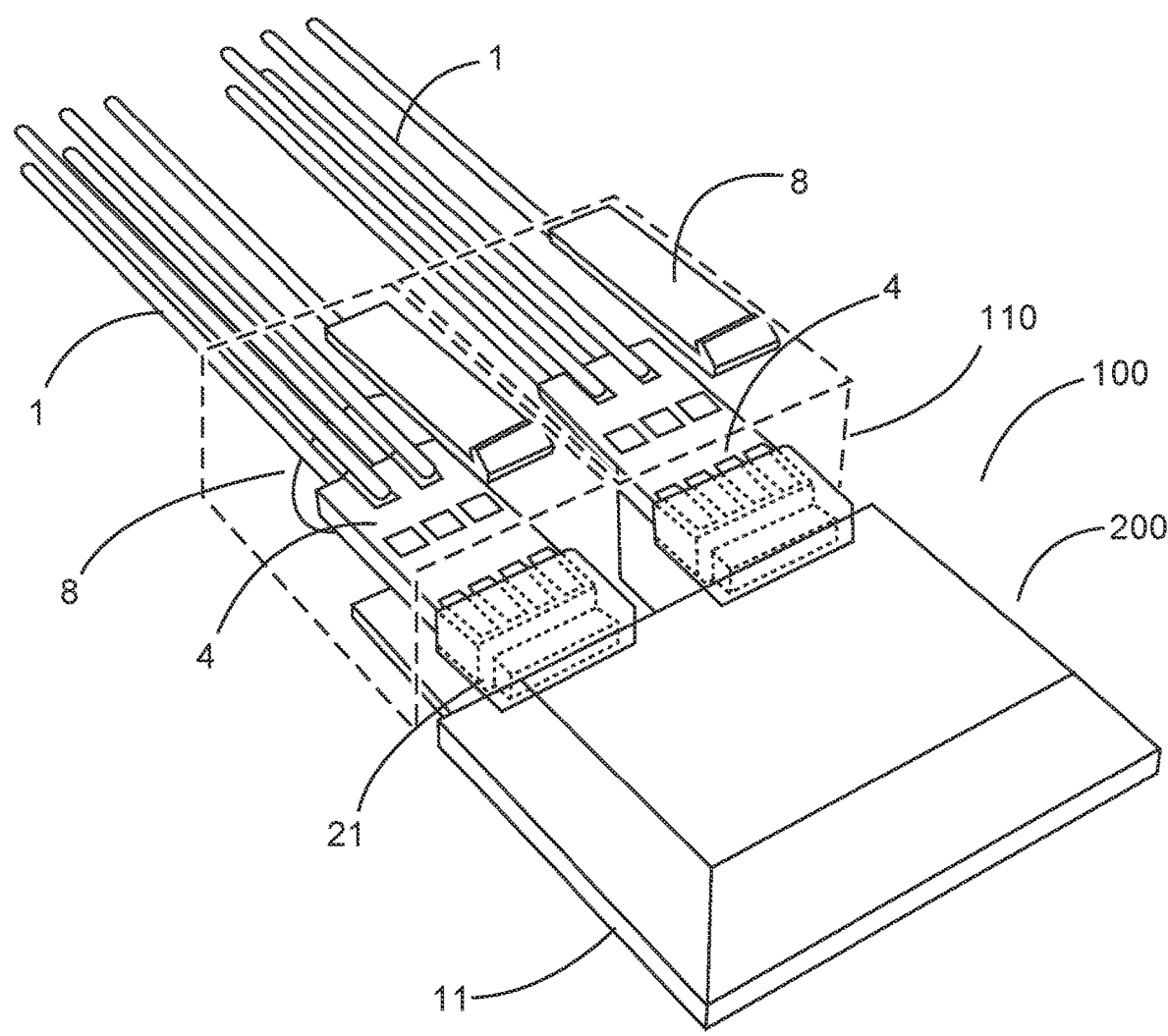
FIG. 3 shows a schematic perspective view of a plug according to a third exemplary embodiment of the invention.

FIG. 3 shows a schematic perspective view of a plug according to a third exemplary embodiment of the invention. The plug 100 according to the third exemplary embodiment corresponds essentially to the plug according to the first exemplary embodiment. Compared to the first and second exemplary embodiments, the printed circuit board is rotated by 90° in the plug, so that the printed circuit board is aligned co-planar with the printed circuit board in the IoT device and standard sockets for contacting can be used in the IoT device.

According to one aspect of the invention, the plug can be plugged into the IoT device rotated by 180°. This is achieved by the double design of the contact surfaces, which are present on the upper side and underside of the printed circuit board, the arrangement being the same on both sides. In addition, the socket in the IoT device can be positioned centrally in the plug-in face.

According to one aspect of the invention, the printed circuit board in the plug is made of a special material (waterproofing, wear behavior, stability, etc.) such as ceramic and can thus be used in the plug-in face without further protection.

According to one aspect of the invention, the contact surfaces are provided as (surface mount device) SMD-mountable gold pads in order to achieve a sufficient plug-in cycle resistance.

Figure 4:
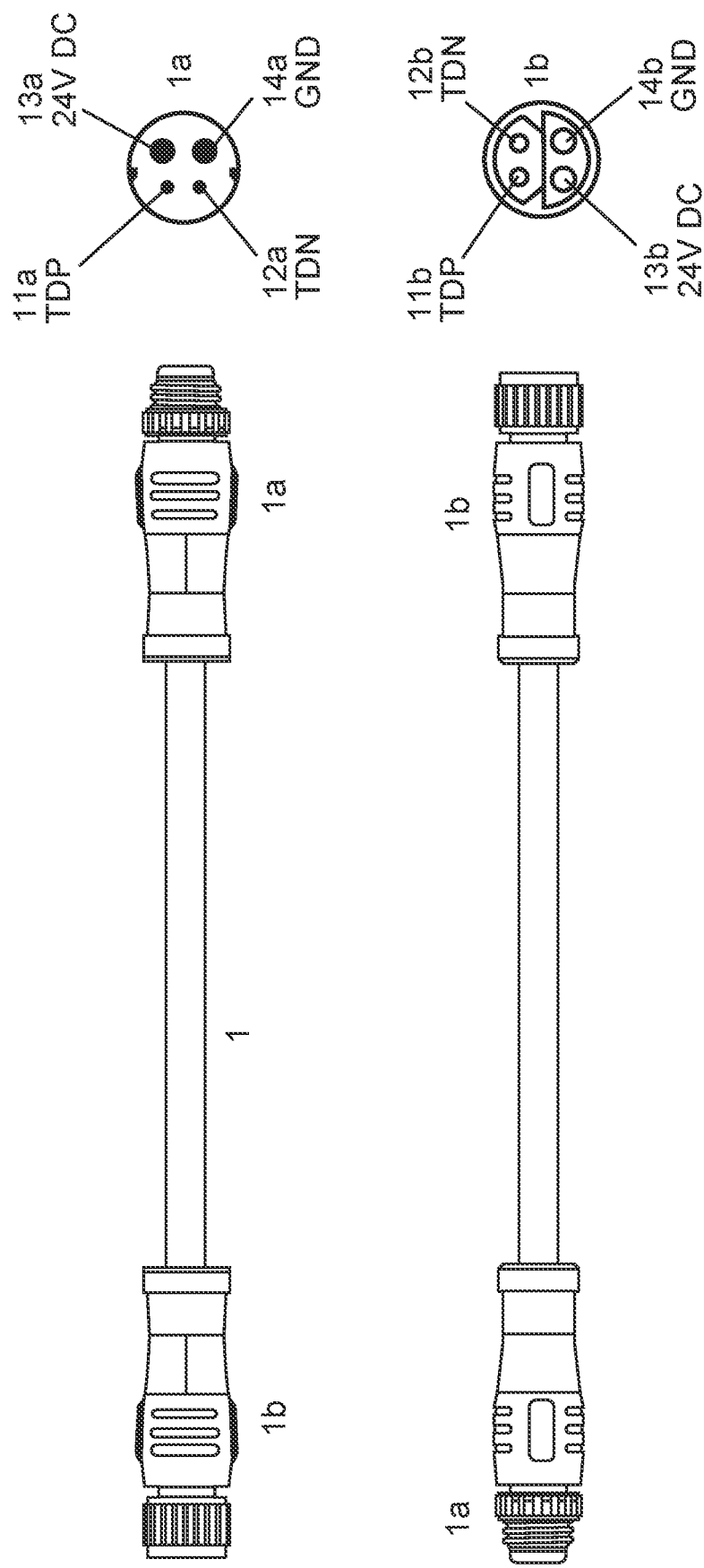
FIG. 4 shows a view of a hybrid single pair Ethernet cable according to an exemplary embodiment of the invention.

FIG. 4 shows a schematic view of a single pair Ethernet cable according to one aspect of the present invention. The cable has M8 H-coded plug connectors. Preferably, the cable has two wires or lines for data communication (for example, 100 Mbps (Megabits per second) and two lines for power transmission (for example, 24 VDC (voltage direct current)). FIG. 4 also shows the two possible plug-in faces. The plug 1a is shown at the top and the socket 1b at the bottom. The plug 1a comprises the two terminals 11a, 12a for data transmission, as well as the terminal 13a for DC transmission and 14a as ground. In the socket 1b, the terminals 11b, 12b for data transmission as well as the terminals 13b, 14b for DC transmission are also provided.

According to one aspect of the present invention, the cable of FIG. 4 corresponds to the IEC 63171-6:2020 standard. A 100 BASE-T1 single pair Ethernet standard (IEE 802.3 bw) can be used for communication. The cable between the plug and the socket complies with the DIN VDE standard 0285-525-2-51/DIN EN 50525-2-51.

According to the invention, the cable and the plug and the socket are an M8 single pair Ethernet hybrid plug according to IEC 63171-6 with integrated protective circuit. According to the invention, the protective circuit is integrated in the socket and/or the plug.

The invention claimed is:

1. A plug for connecting to an Internet-of-Things device, the plug comprising:
    a housing,
    a printed circuit board having a first end and a second end, wherein the printed circuit board is in the housing,
    wherein the first end of the printed circuit board is connected to a hybrid single pair Ethernet cable,
    wherein the second end of the printed circuit board has a plug-in face with a plurality of contact surfaces configured to couple the plug to the Internet-of-Things device, and
    an electromagnetic compatibility protection unit in or on the printed circuit board,
    wherein the electromagnetic compatibility protection unit has at least one diode between DC voltage terminals.

2. The plug according to claim 1, comprising a seal in a region of the second end of the printed circuit board for producing a sealed region around the plug-in face in a plugged-in state.

3. The plug according to claim 2, comprising a locking element outside a region of the housing that is sealed by the seal.

4. The plug according to claim 1, wherein a longitudinal axis of the second end of the printed circuit board of the plug is arranged rotated by 90° with respect to a printed circuit board of the IoT device.

5. The plug according to claim 1, wherein the plug-in face is designed rotationally symmetrical with respect to a 180° rotation and the plug is configured to be inserted into the IoT device after being rotated by 180°.

6. The plug according to claim 1, wherein the plug complies with the IEC63171-6:2020 standard.

7. A hybrid single pair Ethernet cable comprising the plug according to claim 1.

8. An Internet-of-Things device, comprising:
a plug connector with an M8 H-coded connector, and
a plug connected to the plug connector of the Internet-of-Things device, the plug including:
  a housing,
  a printed circuit board having a first end and a second end, wherein the printed circuit board is in the housing,
  wherein the first end of the printed circuit board is connected to a hybrid single pair Ethernet cable,
  wherein the second end of the printed circuit board has a plug-in face with a plurality of contact surfaces configured to couple the plug to the Internet-of-Things device, and
  an electromagnetic compatibility protection unit in or on the printed circuit board,
  wherein the electromagnetic compatibility protection unit has at least one diode between DC voltage terminals.

\* \* \* \* \*